United States Patent
Serrano et al.

(10) Patent No.: US 11,133,767 B2
(45) Date of Patent: Sep. 28, 2021

(54) PULSED ELECTRIC MACHINE CONTROL USING TABLES

(71) Applicant: Tula eTechnology, Inc., San Jose, CA (US)

(72) Inventors: Louis J. Serrano, Los Gatos, CA (US); Paul Carvell, San Jose, CA (US); Adya S. Tripathi, San Jose, CA (US)

(73) Assignee: Tula eTechnology, Inc., San Jose, CA (US)

( * ) Notice: Subject to any disclaimer, the term of this patent is extended or adjusted under 35 U.S.C. 154(b) by 0 days.

(21) Appl. No.: 17/200,048

(22) Filed: Mar. 12, 2021

(65) Prior Publication Data

US 2021/0203263 A1 Jul. 1, 2021

Related U.S. Application Data

(63) Continuation-in-part of application No. 16/912,313, filed on Jun. 25, 2020, and a continuation-in-part of
(Continued)

(51) Int. Cl.
*H02P 6/10* (2006.01)
*H02P 27/08* (2006.01)
*H03M 3/00* (2006.01)

(52) U.S. Cl.
CPC ............ *H02P 27/08* (2013.01); *H02P 27/085* (2013.01); *H03M 3/438* (2013.01); *H03M 3/456* (2013.01)

(58) Field of Classification Search
CPC .......... H02P 27/08; H02P 27/085; H02P 6/10; H03M 3/438; H03M 3/456
See application file for complete search history.

(56) References Cited

U.S. PATENT DOCUMENTS

| | | | |
|---|---|---|---|
| 4,989,146 A | 1/1991 | Imajo | |
| 5,731,669 A * | 3/1998 | Shimizu | .................. B60L 50/60 318/139 |

(Continued)

FOREIGN PATENT DOCUMENTS

| | | |
|---|---|---|
| CN | 102381265 | 3/2012 |
| CN | 204589885 | 8/2015 |

(Continued)

OTHER PUBLICATIONS

Cai et al., "Torque Ripple Reduction for Switched Reluctance Motor with Optimized PWM Control Strategy", https://www.mdpi.com/1996-1073/11/11/3215, Oct. 15, 2018, 27 pages.

(Continued)

*Primary Examiner* — Cortez M Cook

(74) *Attorney, Agent, or Firm* — Beyer Law Group LLP

(57) ABSTRACT

A variety of methods, controllers and electric machine systems are described for pulse control of electric machines (e.g., electric motors and generators). To improve the energy conversion efficiency of the machine, pulse control involves determining if the machine should operate in a continuous mode or pulse mode, and if the latter, defining a magnitude, duty cycle, and frequency for the pulses. One or more tables, indexing by a wide range of speeds and torque requests, is/are used to define the pulsing frequency or a pulsing frequency pattern.

32 Claims, 6 Drawing Sheets

Related U.S. Application Data application No. 16/689,450, filed on Nov. 20, 2019, said application No. 16/912,313 is a continuation of application No. 16/353,166, filed on Mar. 14, 2019, now Pat. No. 10,742,155.

(60) Provisional application No. 62/810,861, filed on Feb. 26, 2019, provisional application No. 62/658,739, filed on Apr. 17, 2018, provisional application No. 62/644,912, filed on Mar. 19, 2018.

(56) References Cited

U.S. PATENT DOCUMENTS

| | | |
|---|---|---|
| 6,829,515 B2 | 12/2004 | Grimm |
| 6,829,556 B2 | 12/2004 | Kumar |
| 7,259,664 B1 | 8/2007 | Cho et al. |
| 7,327,545 B2 | 2/2008 | Konishi |
| 7,558,655 B2 | 7/2009 | Garg et al. |
| 7,577,511 B1 | 8/2009 | Tripathi et al. |
| 8,099,224 B2 | 1/2012 | Tripathi et al. |
| 8,768,563 B2 | 7/2014 | Nitzberg et al. |
| 8,773,063 B2 | 7/2014 | Nakata |
| 9,046,559 B2 | 6/2015 | Lindsay et al. |
| 9,050,894 B2 | 6/2015 | Banerjee et al. |
| 9,308,822 B2 | 4/2016 | Matsuda |
| 9,495,814 B2 | 11/2016 | Ramesh |
| 9,630,614 B1 | 4/2017 | Hill et al. |
| 9,702,420 B2 | 7/2017 | Yoon |
| 9,758,044 B2 | 9/2017 | Gale et al. |
| 9,948,173 B1 | 4/2018 | Qahouq |
| 10,273,894 B2 | 4/2019 | Tripathi et al. |
| 10,742,155 B2 | 8/2020 | Tripathi |
| 10,944,352 B2 | 3/2021 | Mazda et al. |
| 2005/0127861 A1 | 6/2005 | McMillan et al. |
| 2008/0179980 A1 | 7/2008 | Dawsey et al. |
| 2009/0121669 A1 | 5/2009 | Hanada |
| 2009/0146615 A1 | 6/2009 | Zillmer et al. |
| 2009/0179608 A1 | 7/2009 | Welchko et al. |
| 2009/0306841 A1 | 12/2009 | Miwa et al. |
| 2010/0010724 A1 | 1/2010 | Tripathi et al. |
| 2011/0130916 A1 | 6/2011 | Mayer |
| 2011/0208405 A1 | 8/2011 | Tripathi et al. |
| 2012/0169263 A1 | 7/2012 | Gallegos-Lopez et al. |
| 2014/0217940 A1* | 8/2014 | Kawamura .......... B62D 5/0481 |
| | | 318/400.26 |
| 2014/0265957 A1 | 9/2014 | Hu et al. |
| 2014/0292382 A1 | 10/2014 | Ogawa et al. |
| 2014/0354199 A1 | 12/2014 | Zeng et al. |
| 2015/0318803 A1 | 11/2015 | Wu et al. |
| 2016/0226409 A1* | 8/2016 | Ogawa ..................... H02P 6/10 |
| 2016/0269225 A1 | 9/2016 | Kirchmeier et al. |
| 2017/0087990 A1 | 5/2017 | Neti et al. |
| 2017/0331402 A1 | 11/2017 | Smith et al. |
| 2018/0045771 A1 | 2/2018 | Kim et al. |
| 2018/0154786 A1* | 6/2018 | Wang ..................... H02P 6/28 |
| 2018/0276913 A1 | 9/2018 | Garcia et al. |
| 2019/0288629 A1 | 9/2019 | Tripathi |
| 2019/0288631 A1 | 9/2019 | Tripathi |
| 2020/0328714 A1 | 10/2020 | Tripathi |

FOREIGN PATENT DOCUMENTS

| | | |
|---|---|---|
| CN | 205229379 | 5/2016 |
| CN | 106932208 | 7/2017 |
| CN | 107067780 | 8/2017 |
| CN | 105196877 | 9/2017 |
| CN | 207129052 | 3/2018 |
| CN | 108216026 | 6/2018 |
| CN | 108445386 | 8/2018 |
| JP | 10243680 | 9/1998 |
| KR | 10-2017-0021146 | 2/2017 |
| KR | 10-2017-0032976 | 3/2017 |
| WO | WO 2012/010993 | 1/2012 |

OTHER PUBLICATIONS

Spong et al., "Feedback Linearizing Control of Switched Reluctance Motors", IEEE Transactions on Automatic Control, vol. AC-32, No. 5, May 1987, pp. 371-379.

Serrano et al, U.S. Appl. No. 16/689,450, filed Nov. 20, 2019.

International Search Report and Written Opinion dated Feb. 2, 2021 from International Application No. PCT/US2020/055412.

* cited by examiner

|  | VEHICLE SPEED (km/hr) | | | | | | | |
|---|---|---|---|---|---|---|---|---|
|  | 0 | 10 | 20 | 30 | 40 | 50 | 60 | 70 |
| OPTIMAL TORQUE (N*m) | 0 | 30 | 60 | 70 | 85 | 110 | 85 | 75 |

FIG. 3A

$\sim$ 32

30

Pulsing Frequency (Hz)

| Torque (N*m) | | | | | | | | |
|---|---|---|---|---|---|---|---|---|
| 100 | 0 | 0 | 0 | 0 | 0 | 10 | 0 | 0 |
| 90 | 0 | 0 | 0 | 0 | 0 | 19 | 0 | 0 |
| 80 | 0 | 0 | 0 | 0 | 7 | 28 | 7 | 0 |
| 70 | 0 | 0 | 0 | 0 | 19 | 37 | 19 | 8 |
| 60 | 0 | 0 | 0 | 15 | 30 | 46 | 30 | 21 |
| 50 | 0 | 0 | 18 | 30 | 42 | 46 | 42 | 34 |
| 40 | 0 | 0 | 34 | 44 | 48 | 37 | 48 | 48 |
| 30 | 0 | 0 | 51 | 44 | 36 | 28 | 36 | 41 |
| 20 | 0 | 34 | 34 | 30 | 25 | 19 | 25 | 28 |
| 10 | 0 | 34 | 18 | 15 | 13 | 10 | 13 | 14 |
| 0 | 0 | 0 | 0 | 0 | 0 | 0 | 0 | 0 |
|  | 0 | 10 | 20 | 30 | 40 | 50 | 60 | 70 |

VEHICLE SPEED (km/hr)

| 45 | 47 | 46 |
|---|---|---|

PULSED ELECTRIC MACHINE CONTROL USING TABLES

CROSS-REFERENCE TO RELATED APPLICATIONS

This application is a Continuation-in-Part of U.S. application Ser. No. 16/912,313, filed on Jun. 25, 2020 which is a Continuation of U.S. application Ser. No. 16/353,166, filed on Mar. 14, 2019 (now U.S. Pat. No. 10,742,155, issued on Aug. 11, 2020), which claims priority of U.S. Provisional Patent Application Nos. 62/644,912, filed on Mar. 19, 2018; 62/658,739, filed on Apr. 17, 2018; and 62/810,861 filed on Feb. 26, 2019.

This application is also a Continuation-in-Part of U.S. application Ser. No. 16/689,450, filed on Nov. 20, 2019. All of the foregoing priority applications are incorporated herein by reference in their entirety.

BACKGROUND

The present application relates generally to pulsed control of electric machines for vehicles, and more particularly, to using one or more tables that provide pulse frequency values, for a wide range of different engine speeds and torque demand combinations, which optimize electric machine efficiency without generating unacceptable levels of Noise, Vibration and Harshness (NVH).

Electric motors and generators are structurally very similar. Both include a stator having a number of poles and a rotor. In fact, many electrical motors can operate as a generator and vice-versa. When operating as motor, electrical energy is converted into mechanical energy. When operating as a generator, mechanical energy is converted into electrical energy. The term "machine" as used herein is therefore intended to be broadly construed to mean both electric motors and generators.

Electric machines can operate using either direct current (DC) or alternating current (AC).

Representative DC machines include brushless, electrically excited, permanent magnet, series wound, shunt, brushed, compound, and others.

With AC machines, there are two general varieties, asynchronous and synchronous. An example of an asynchronous electric machine is a three-phase induction motor.

Modern electric machines have relatively high energy conversion efficiencies, provided they are operating at or near their optimal operational load. When operating outside of their optimal operation load, however, the energy conversion efficiency can be considerably lower. With many applications, a machine is required to operate under a wide variety of different operating load conditions. As a result, machines typically operate at or near the highest levels of efficiency at certain times, while at other times they operate at lower efficiency levels.

Battery powered electric vehicles and some hybrid electric/gas vehicles provide a good example of an electric machine operating at a wide range of efficiency levels. During a typical drive cycle, such vehicles will accelerate, cruise, de-accelerate, brake, corner, etc. Within certain motor speeds and/or torque ranges, the electric machine operates at or near its most efficient operating point (i.e., the "sweet spot"). Outside these ranges, the operation of electric machine is less efficient. As driving conditions change, the machine transitions between high and low operating efficiency levels as the motor speed and/or torque changes.

If the electric machine could be made to operate a greater proportion of a drive cycle in high efficiency operating regions, the range of the vehicle for a given battery charge level would be increased. Since the limited range of battery powered electric vehicles is a major commercial impediment to their use, extending the operating range of the vehicle is highly advantageous.

A need therefore exists to operate electric machines, such as motors and generators, at higher levels of efficiency.

SUMMARY

A variety of methods, controllers and electric machine systems are described for pulse control of electric machines (e.g., electric motors and generators) used for propelling vehicles. To improve the energy conversion efficiency of the machine, pulse control involves determining if the machine should operate in a continuous mode or pulse mode, and if the latter, defining a magnitude, duty cycle and frequency for the pulses. A table, indexed by a wide range of vehicle speeds and torque requests, is used to define a pulsing frequency or a pattern of pulsing frequencies.

In one non-exclusive embodiment, the present invention is directed to a method for pulse controlling an electric machine used to propel a vehicle by pulsing the electric machine at a frequency obtained from a table that is indexed based a combination of a speed of the vehicle and a requested torque.

In another non-exclusive embodiment, an electric machine controller for controlling pulsing of an electric machine onboard a vehicle is disclosed. The electric machine controller is arranged to ascertain a current vehicle speed and a torque request, look up or otherwise obtain a pulsing frequency from a table and control operation of the electric machine using the pulsing frequency obtained from the table.

In yet another embodiment, the electric machine controller is arranged to determine if a requested torque is within a pulsed control range of the electric machine and either (1) continuously operate the electric machine in a non-pulsed mode if the requested torque is determined to be outside of the pulsed control range or (2) operate the electric machine in the pulsed mode if the requested torque is within the pulsed control range. In the case of the latter, the electric machine controller is further arranged to determine a magnitude of the on pulses, determine a duty cycle for the on pulses; and obtain the frequency of the on pulses from the table as mentioned above.

In yet other embodiments, the table includes multiple entries that are each indexed by a range of vehicle speeds and a range of torque requests. In addition, each of the entries in the table may define (a) at least one frequency, (b) multiple frequencies and/or (c) a pattern of frequencies. In the case of operating the motor using multiple and/or a pattern of frequencies, excitation of resonant mechanical vibrations can be reduced or avoided.

In another embodiment, the electric machine controller is arranged to modify the frequency obtained from the table if non-drivetrain sources of NVH exceed a threshold. If the non-drive train sources of NVH exceed the threshold, then the frequency is typically lowered to obtain even greater operational efficiencies of the motor, but at the expense of additional motor and/or drivetrain NVH. However, the additional NVH is typically masked out by the non-drivetrain sources of NVH. As a result, the driving experience for occupants is typically not adversely or materially affected.

In yet other embodiments, the entries in the table can be derived from empirical data, modeled data or a combination thereof.

In yet other embodiments, the pulse control of an electric machine can be applied for any situation or environment in which an electric machine may possibly be used and is not limited to just vehicle applications.

BRIEF DESCRIPTION OF THE DRAWINGS

The invention and the advantages thereof, may best be understood by reference to the following description taken in conjunction with the accompanying drawings in which:

FIG. 3A illustrates a representative table that provides optimum torque values in accordance with a non-exclusive embodiment of the invention.

FIG. 3B illustrates a representative table that provides pulse frequency values in accordance with a non-exclusive embodiment of the invention.

FIG. 3C illustrates an alternative embodiment of a table that provides multiple pulse frequency values for one or more table entries in accordance with another non-exclusive embodiment of the invention

In the drawings, like reference numerals are sometimes used to designate like structural elements. It should also be appreciated that the depictions in the figures are diagrammatic and not to scale.

DETAILED DESCRIPTION

Figure 1:
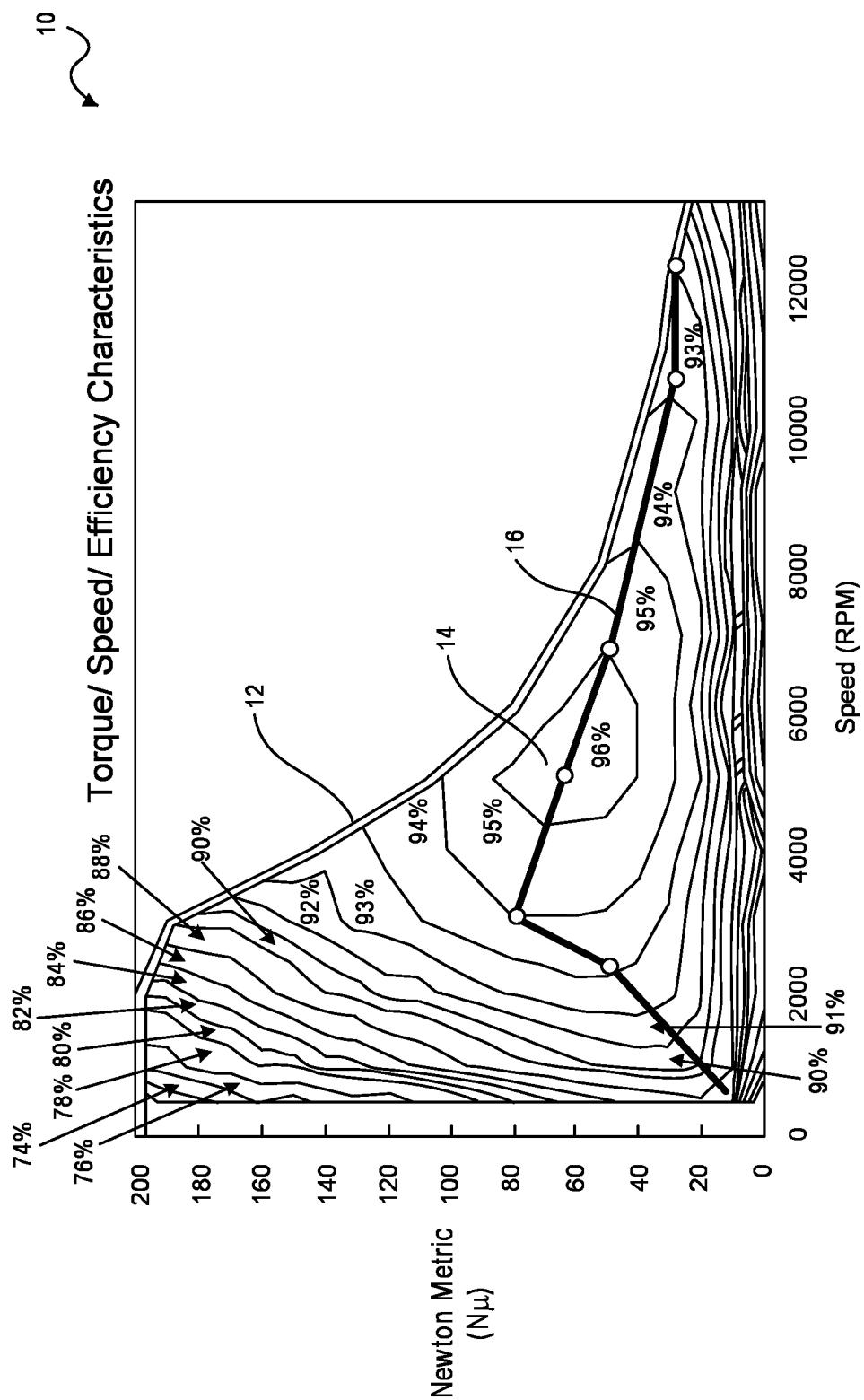
FIG. 1 is a representative Torque/Speed/Efficiency graph illustrating the energy conversion efficiency of a representative electric motor under different operating conditions.

Electric motors and generators are used in a very wide variety of applications and under a wide variety of operating conditions. In general, many modern electric machines have relatively high energy conversion efficiencies. However, the energy conversion efficiency of most electric machines can vary considerably based on their operational load. Many applications require that the electric machine operate under a wide variety of different operating load conditions, which means that the electric machine often does not operate at its peak efficiency levels.

The present disclosure relates generally to pulsed control of electric machines (e.g., electric motors and generators) to improve the energy conversion efficiency of the electric machine when operating conditions warrant. More specifically, under selected operating conditions, an electric machine is intermittently pulsed to operate at higher efficiency levels compared to conventional continuous motor control, thereby delivering a desired average torque output in a more energy efficient manner than previously possible.

The Applicant has filed a number of applications related to the pulse control of electric machines, including U.S. Provisional Patent Application No. 62/644,912, filed on Mar. 19, 2018, U.S. Provisional Patent Application No. 62/810,861, filed on Feb. 26, 2019, U.S. Provisional Application No. 62/819,097, filed Mar. 15, 2019 and U.S. Provisional Patent Application No. 62/658,739, filed Apr. 17, 2018. Each of the above-listed applications are incorporated by reference herein for all purposes Efficiency Maps Referring to FIG. 1, a motor efficiency map 10 that illustrates the nature of the above-defined problem is shown. In particular, the map 10 diagrammatically shows the efficiency of a representative motor under a wide range of different motor speeds (the X-axis) and torque values (the Y-axis). A number of operating characteristics of the motor are evident from the map 10. These characteristics include:

(a) The illustrated motor is generally most efficient when it is operating within a particular speed range and generating torque within a defined range. For the particular motor shown, the most efficient region is the area designated by reference number 14, which is generally in the range of 4500-6000 RPM with a torque output in the range of about 40-70 Nm. In this region 14, the energy conversion efficiency of the motor is approximately 96%. The region 14 is thus sometimes referred to herein as the "sweet spot", which is the most efficient operating region for a given machine.

(b) At any particular motor speed, there will be a corresponding most efficient output torque, which is diagrammatically illustrated by a maximum efficiency curve 16. The motor's efficiency, for any given motor speed, tends to drop off somewhat when the load is higher or lower than the most efficient load. In some regions the motor's efficiency tends to drop relatively quickly, as for example, when the torque output falls below about 30 Nm in the illustrated exemplary motor.

(c) Also, when the desired motor torque is below the most efficient output torque as designated by the curve 16 for a given current motor speed, the overall efficiency of the motor can be improved by pulsed operation. Conversely, when the desired motor torque is at or above the maximum efficiency curve 16, the motor may be operated in a conventional (i.e., continuous/non-pulsed) manner to most efficiently deliver the desired torque.

Based on the above-defined observations, it is clear that the overall energy conversion efficiency of the motor could be significantly improved if the operating conditions are controlled so that the motor is almost always operated at or near its "sweet spot" designated by region 14. Unfortunately, many applications require that the motor operate over a wide range of varying torque requirements, and/or widely varying motor speeds, often which fall outside of the sweet spot.

One such application is automotive and other vehicle or mobility applications where the electric motor is often coupled to the driven component(s) (such as the wheels) with a fixed speed ratio. In this case, the motor speed is proportional to the vehicle speed so long as the motor is engaged with the vehicle's wheels. Over a typical drive cycle the motor speed may vary between zero when the vehicle is stopped to a relatively high RPM when cruising at highway speeds. The torque requirements may also vary widely at any of those speeds based on factors such as whether the vehicle is accelerating or decelerating, going uphill, downhill, going on relatively flat terrain, vehicle weight, and many other factors. Of course, motors used in other applications may be subjected to a wide variety of operating conditions as well.

With pulsed control, the output of the machine is intelligently and intermittently modulated between "torque on" and "zero (no) torque" states in a manner that: (1) meet operational torque demands, while (2) improving overall efficiency. Stated differently, under selected operating conditions, the electric machine is intermittently driven at a more efficient energy conversion operating level (the "torque on" state) to deliver a desired output. In the periods between the pulses, the machine ideally does not generate or consume any torque (the "zero torque" state). This can conceptually be thought of as turning the electric machine "off." In some implementations, this can be accomplished by effectively turning the electric machine "off," as for example, by shutting off drive current to a motor or the excitation current for a generator. However, in other implementations, the electric machine may be controlled during the "zero torque" state in a manner that attempts to cause the torque generated by the electric machine to be zero or as close to zero as practical or appropriate for the particular machine. In some implementations, any power converters used in conjunction with the electric machine may effectively be turned off for at least portions of the "zero torque" periods as well.

The efficiency map illustrated in FIG. 1, which happens to be for an internal permanent magnet synchronous motor used in a 2010 Toyota Prius, is merely illustrative. Similar efficiency maps can be generated for just about any electric machine although the operating characteristics of each map will vary from one machine to the next. The map of FIG. 1 should therefore not be construed as limiting in any regard.

Pulsed Motor Operation and Duty Cycles

Figure 2A:
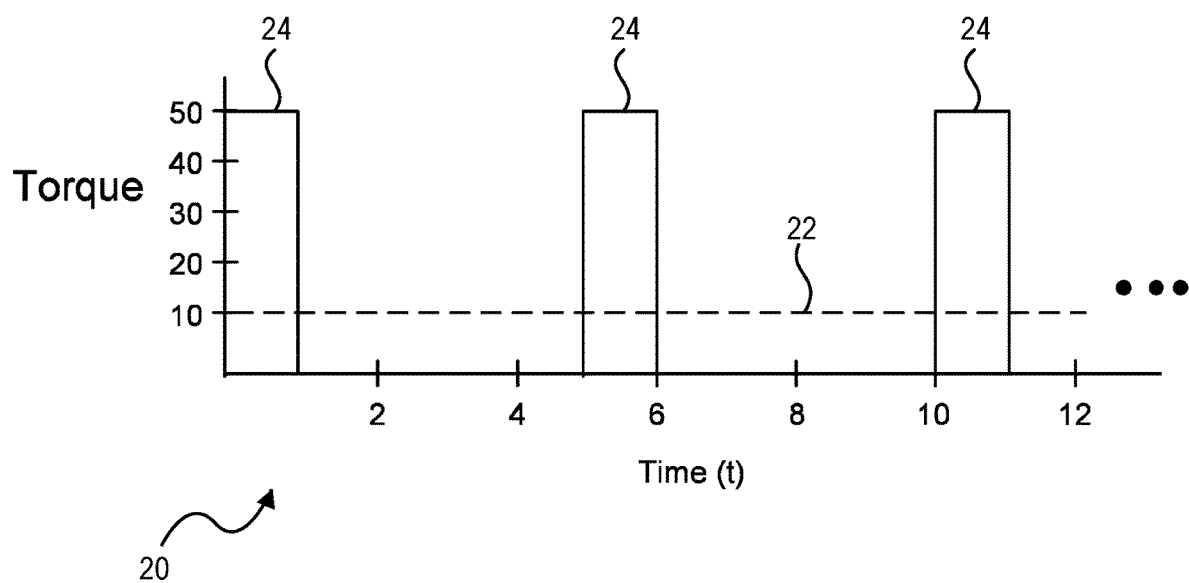
FIG. 2A is a graph illustrating a pulsed drive signal for an electric machine.

FIG. 2A is a plot 20 that illustrates an example of pulsed motor operation. In this particular example, the desired motor torque is 10 Nm (as designated by the dashed line 22). The peak efficiency of this particular motor, however, is at an output of 50 Nm of torque.

The plot 20 is useful in illustrating how the motor can be operated in different modes, each resulting in the generation of the desired motor torque of 10 Nm. However, as explained below, efficiency of the motor can be improved depending on which mode of operation is selected.

In a first mode, the motor can be run continuously, generating a steady output of 10 Nm. As noted above, since a steady output of 10 Nm is well below the most efficient output of the motor, this mode of operation is clearly less than ideal from an efficiency point of view.

In a second mode, the motor can be driven at its peak efficiency output of 50 Nm, but for only 20% of the time and delivering zero (no) torque the remaining 80% of the time. In other words, by pulsing the motor on using a twenty percent (20%) duty cycle at peak efficiency of 50 Nm, and off the remaining eighty percent (80%) of time between pulses, the same net output of 10 Nm is realized, but the overall efficiency of the motor is significantly improved.

FIG. 2A illustrates the second mode of operation. The on pulses 24 have a magnitude of 50 Nm and a time period of 1 time unit out of every 5 time units (i.e., 20%). During the intervening 4 time periods (80%), the motor is controlled to produce zero torque. The net result is the average torque output is the desired 10 Nm, but with the motor operating almost exclusively in the peak efficiency range, overall efficiency is significantly improved.

The second mode of operation can be widely varied to meet changing operational torque demands. For instance:
  (a) If the desired motor output changes to 20 Nm, the duty cycle of the motor operating at 50 Nm can be increased to 40%;
  (b) If the desired motor output changes to 40 Nm, the duty cycle can be increased to 80%;
  (c) If the desired motor output changes to 5 Nm, the duty cycle can be reduced to 10% and so on.

As long as the desired motor output does not exceed the peak efficiency of 50 Nm, the desired motor output can be met merely by changing the duty cycle of the motor operating at 50 Nm. As each of these examples illustrate, pulsing the motor will advantageously yield efficiency benefits when the desired motor torque falls below the maximum efficiency curve 16.

The timing of the on and/or off time units actually used may vary widely based on the size, nature and design needs of any particular machine system. In practice, when the motor is switched from the "torque on" state to the "zero torque" state relatively rapidly to achieve a desired duty cycle, the fact that the motor is actually being switched back and forth between these states may not materially degrade the performance of the motor from an operational standpoint. In some embodiments, the timing of the periods for each on/off cycle may widely vary. For example, in the above listed priority applications, the expected on/off cycle is described as being in the order of 100 μsec to 0.10 seconds (i.e. pulsing at a frequency in the range of 10 to 10,000 Hz), as for example in the range of 20 to 1000 Hz, or 20 to 100 Hz. The appropriate pulsing frequency may be a function of the type of electric machine being controlled and the application's tolerance for NVH that may be introduced by pulsing.

The zero torque portions of the pulse cycle might conceptually be viewed as shutting the motor off, although in many cases the motor may not actually be shut off during those periods or may be shut off for only portions of the "zero torque" intervals.

Pulsing of Alternating Current (AC) Motors

Figure 2B:
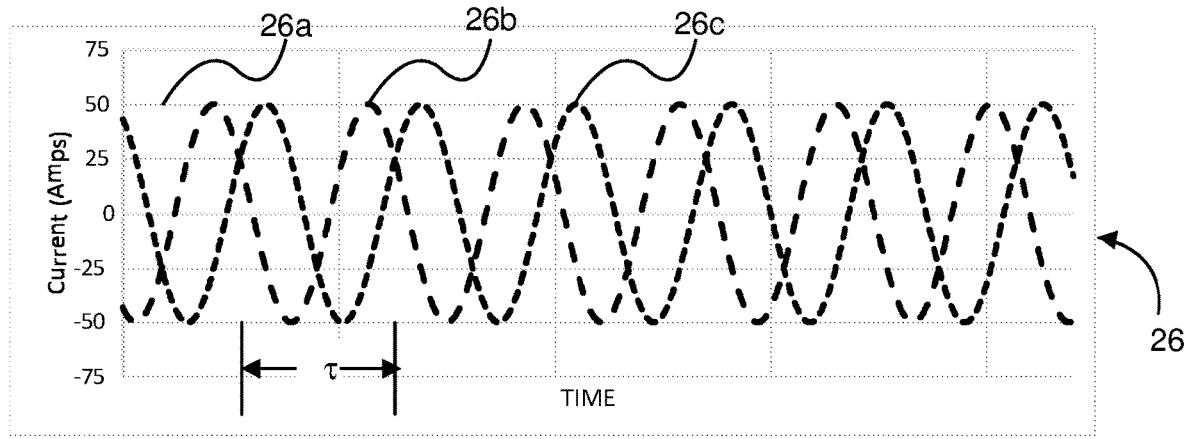
FIG. 2B is a diagrammatic representation of a continuous three-phase AC drive signal waveform.
Figure 2C:
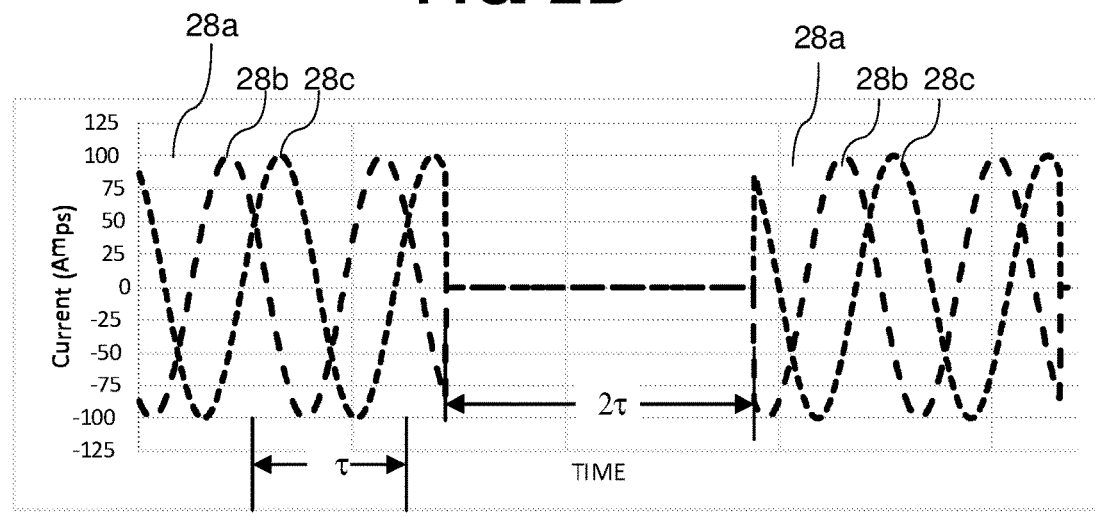
FIGS. 2C and 2D are two different examples of pulsed three-phase AC waveforms having a 50% duty cycle that represent the same average power as the continuous waveform of FIG. 2B.
Figure 2D:
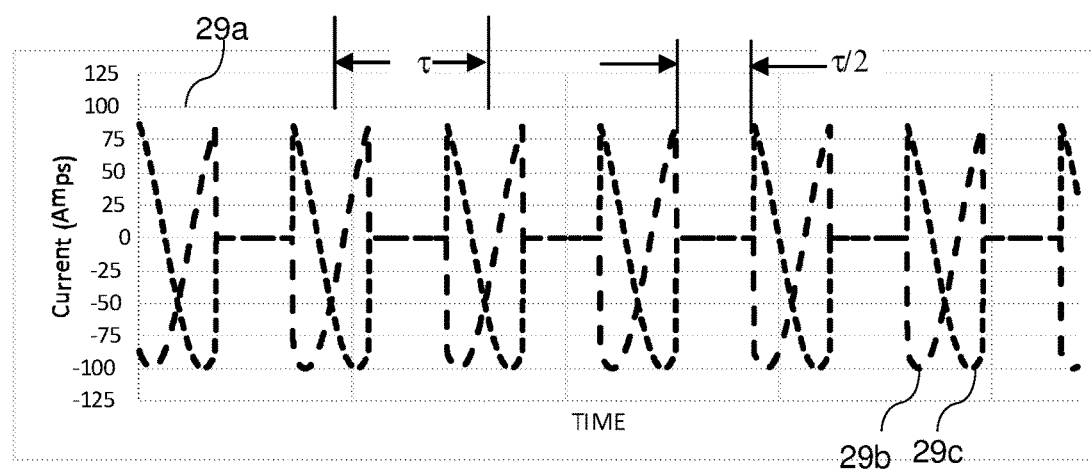

Many electric machines are designed to operate using alternating current. FIGS. 2B-2D are plots illustrating the difference between continuous and pulsed alternating currents that may be input to an electric machine operating as a motor, as for example, a three-phase induction motor. In each plot, current is plotted on the vertical axis and time is plotted along the horizontal axis.

FIG. 2B illustrates conventional sinusoidal three-phased input current 26a, 26b, and 26c delivered to the electric machine. Phase B, denoted by 26b, leads phase A, denoted by 26a by 120 degrees. Phase C, denoted by 26c, leads phase B by 120 degrees. The sine wave period is τ. The three-phased input power 26 is continuous (not pulsed) and has a designated maximum amplitude of approximately 50 amps. It should be appreciated that 50 amps is only a representative value and the current may have any value.

FIGS. 2C and 2D illustrate two examples of different pulsed three-phased currents 28a-c and 29a-c respectively, each having a fifty percent (50%) duty cycle and peak amplitude of approximately 100 amps. As in FIG. 2B the period of the base sine wave is τ, however, now the sine wave is modulated on and off. Assuming the motor speed is the same and the generated torque is substantially proportional to current, as is often the case, the delivered current in FIGS. 2C and 2D produces the same average torque as the continuously applied three-phased input current of FIG. 2B. The difference between pulsed currents 28a-c and 29a-c is the duration of their respective current pulses and the interleaved "off" periods.

In FIG. 2C, the current pulses 28a-c are interleaved with "off" periods and "on" periods of equal length, both of which are 2τ.

In FIG. 2D, the current pulses 29a-c and the interleaved "off" periods again have equal duration. In this case the duration is τ/2.

In both examples, the duty cycle is 50%. However, the duration of the "on" and "off" time durations is different, i.e. the frequency of the pulsed modulation is different. The frequency of the pulsed modulation may vary based on the type of electrical machine used, noise and vibration considerations, current operating rotor speed and other factors.

FIGS. 2C-2D illustrate applications in which the "on" motor drive pulses are evenly spaced while the motor is operated at a steady state desired output level. Such an approach works well in many circumstances, but is not a requirement. The duty cycle need not be 50%, but can be adjusted to match the desired average output torque. Also, the phase of the on/off pulses need not be synchronized with the phase of the applied AC power. Thus, the relative sizes and/or timing of the motor drive pulses can be varied as long as they average out to deliver the desired torque.

Electric Machines and Vehicles

Electric vehicles are now common and are increasing in popularity. It has been predicted that over the course of the next decade or two, electric vehicles will surpass or altogether replace conventional internal combustion engine vehicles.

With electric vehicles, one or more onboard machines is/are provided. When driving the vehicle, the machine acts as a motor to generate torque, which in turn, is used to propel the vehicle. In the case of an electric vehicle, the electric machine(s) is/are used exclusively to generate the needed torque. The torque may be a positive torque to propel the vehicle or a negative torque to transfer vehicle kinetic energy into stored electrical energy. With hybrid vehicles, the onboard electric machines may be used either exclusively, or in cooperation with, an internal combustion engine, to propel the vehicle. With regenerative braking, the machine is typically used to convert mechanical energy into electrical energy that is stored in a storage device, such as a battery or capacitor. The stored energy can be used by the electric machine when operating as a motor, or alternatively to power other electrical systems on the vehicle, such as the air conditioner, heater, defroster, various lighting systems, entertainment system, etc.

The pulsing of an onboard machine when operating as a motor on a vehicle promises significant advantages for increased efficiency. By increasing efficiency, the range of the vehicle can be increased before either a battery recharge is needed and/or refueling is needed as is the case with hybrids. For example, if an electric vehicle with a range of 300 miles can increase its range by ten percent (10%) by operating the onboard motors more efficiently, then the range is extended by approximately another 30 miles.

While pulsing the motor onboard a vehicle will clearly improve efficiency, there are some practical limitations. If the pulsing frequency is too rapid, some of the efficiency gains may be lost. On the other hand if the pulsing frequency is too slow, low frequency mechanical vibrations may result from turning the motor on and off. Since humans are most sensitive to low frequency mechanical vibrations in the 2-8 Hz frequency range, a pulsing frequency within this range may result in high or even unacceptable levels of NVH. Thus, for vehicles, the ideal pulsing frequency of electrical motors is typically at a higher frequency rate, but not too high such that efficiency gains resulting from pulsed operation are lost in switching transients.

Defining Pulse Parameters

With the pulsing of electric motors to meet a requested torque, the critical parameters that can be controlled include (1) the magnitude of the pulses, (2) the duty cycle and (3) the pulse rate or frequency. With vehicles powered by electric motors, the first parameter may be a function of the type of electric machine and its rotational velocity. In other words, the magnitude of the pulses is dictated by the optimal efficiency value of the motor at the current speed of the vehicle (i.e., the maximum efficiency curve 16 of FIG. 1). With the magnitude of the pulses known, determining the duty cycle is straight forward. The duty cycle is dictated by the ratio of the requested torque versus the optimal torque when the machine is operating at the optimal efficiency value. Accordingly, the first two parameters are readily determined.

Determining the third parameter, the frequency of the pulses, however, is more challenging. As noted above, generally the lower the pulse frequency, the more efficient the motor will be. NVH, however, may become excessive if the pulse frequency is too slow. The objective then is to select, for a given torque request and vehicle speed, a minimum pulse frequency that meets acceptable levels of NVH.

Tables

A proposed approach of selecting a minimum pulse frequency that meets acceptable levels of NVH is the use of one or more two-dimensional table(s). With such an approach, a table is constructed using empirical or modeled data for a given vehicle-motor combination. From the data, a table is constructed that defines a minimum pulse frequency, or a pattern of minimum pulse frequencies, that meets acceptable levels of NVH for a wide range of vehicle speeds and torque request combinations.

Referring to FIG. 3A, an exemplary one-dimensional table 32 is provided. Table 32 lists the most efficient output torque generated by a motor for a range of motor speeds when operating at its maximum efficiency point. The table 32 is therefore analogous to the curve 16 of FIG. 1, but in tabular form. It should be noted that the exemplary table 32 is for a different motor than as depicted in FIG. 1. As such, the particular values provided in Table 32 are different than depicted in FIG. 1.

Referring to FIG. 3B, an exemplary two-dimensional table 30 is provided. In this example, the rows are indexed by torque requests ranging from 0 to 100 Nm in increments of 10. The columns are indexed by vehicle speeds ranging from 0 to 70 kilometers per hour (Kph), in increments of 10 Kph. At the intersection of any torque request/speed value, a pulse frequency is provided. Interpolation can be used when the torque or speed values are not equal to the row/column headers.

During driving, various torque demands will be placed on the machine by the driver as the vehicle accelerates and/or decelerates to different speeds. Tables 30 and 32 may be used to determine the pulse frequency appropriate for the current driving conditions. For example, assume a torque request of 30 Nm is made while the vehicle is traveling at a speed of 30 Kph. From table 32, the optimum torque at 30 Kph is 70 Nm. Since the torque request is less than the optimum torque, pulsed operation is appropriate. The duty cycle can readily be determined as the ratio of the requested torque to the optimum torque. In this example, the duty cycle equals 30/70 or approximately forty-three percent (43%). Indexing the table 30 indicates that the appropriate pulsing frequency under these conditions is 44 Hz based on the corresponding entry for this particular speed/torque request combination. If the torque request subsequently changes to 20 Nm, then the duty cycle would equal 20/70 or approximately twenty-eight percent (28%) and the pulse frequency would be 30 Hz from the indexed entry in table 30.

As noted above, for a given vehicle and machine type, a table is typically constructed using empirical or modeled data. In each case, the experiments are run, or data modeled and calculated, to determine a preferred minimum pulse frequency that meets acceptable levels of NVH, for a wide range of vehicle speeds and torque request combinations. Once a table 30 is constructed, it may be employed on the corresponding vehicle to control the pulsing frequency of the onboard motor(s). With this in mind, it should be understood that the values provided in tables 30 and 32 are merely exemplary and should not be construed as limiting in any regard.

It is also noted that the tables do not necessarily need to be indexed by vehicle speeds and torque requests. On the contrary, other parameters can be used. For example, instead of indexing only using vehicle speed, other parameters such as the rotational speed of the electric machine, a function or quantity proportional thereto, or some combination thereof, may be used.

Frequency Patterns and/or Dithering

It is further noted that when constructing either a one-dimensional table (e.g., table 32) or a two-dimensional table (e.g. table 30), each entry need not be limited to a single frequency. In alternative embodiments, one or more entries in the table may define multiple frequencies or a pattern of frequencies. By providing a pattern of different frequencies, typically all close to the original frequency, certain issues such as ringing at a resonate frequency, can be avoided or mitigated. For example if a vehicle is cruising at a given speed for relatively long period of time, the repeated pulsing at the same frequency (e.g., 44 Hz) may result in mechanical or a resonate vibrations. By using a pattern of frequencies, all close to the original frequency (i.e., 45 Hz, 47 Hz, 46 Hz, etc.), resonate mechanical vibrations can be reduced or avoided. The concept of using multiple frequencies or a pattern of frequencies for controlling the pulsing rate is sometimes referred to as dithering.

Referring to FIG. 3C, a simple example of providing a multiple and/or a pattern of frequencies for an entry in the table 30 is illustrated. In this simple example, the table entry defined by the intersection of a vehicle speed of 30 Kph and a torque request of 30 Nm includes a pattern of multiple frequencies including 45 Hz, 47 Hz an 46 Hz, as opposed to just a single entry of 44 Hz (as illustrated in FIG. 3B). For the sake of simplicity, FIG. 3C shows only a single entry in the table 30 containing multiple frequencies and/or a pattern of frequencies. It should be understood that any or all of the entries may contain multiple frequencies and/or a pattern of frequencies.

In yet other embodiments, dithering may be used. With dithering, the entries in the table 30 contain base frequencies, to which random value(s) is/are added so that the pulsing frequency varies. The random frequency value may extend over a fixed range, for example, 0 to 5 Hz, may be proportional to the table entry value, for example, 0 to 10%, or may vary with each table entry in a predetermined manner. A dithering adder may change the dither frequency after each table access.

Motor Controller Architecture

Figure 4:
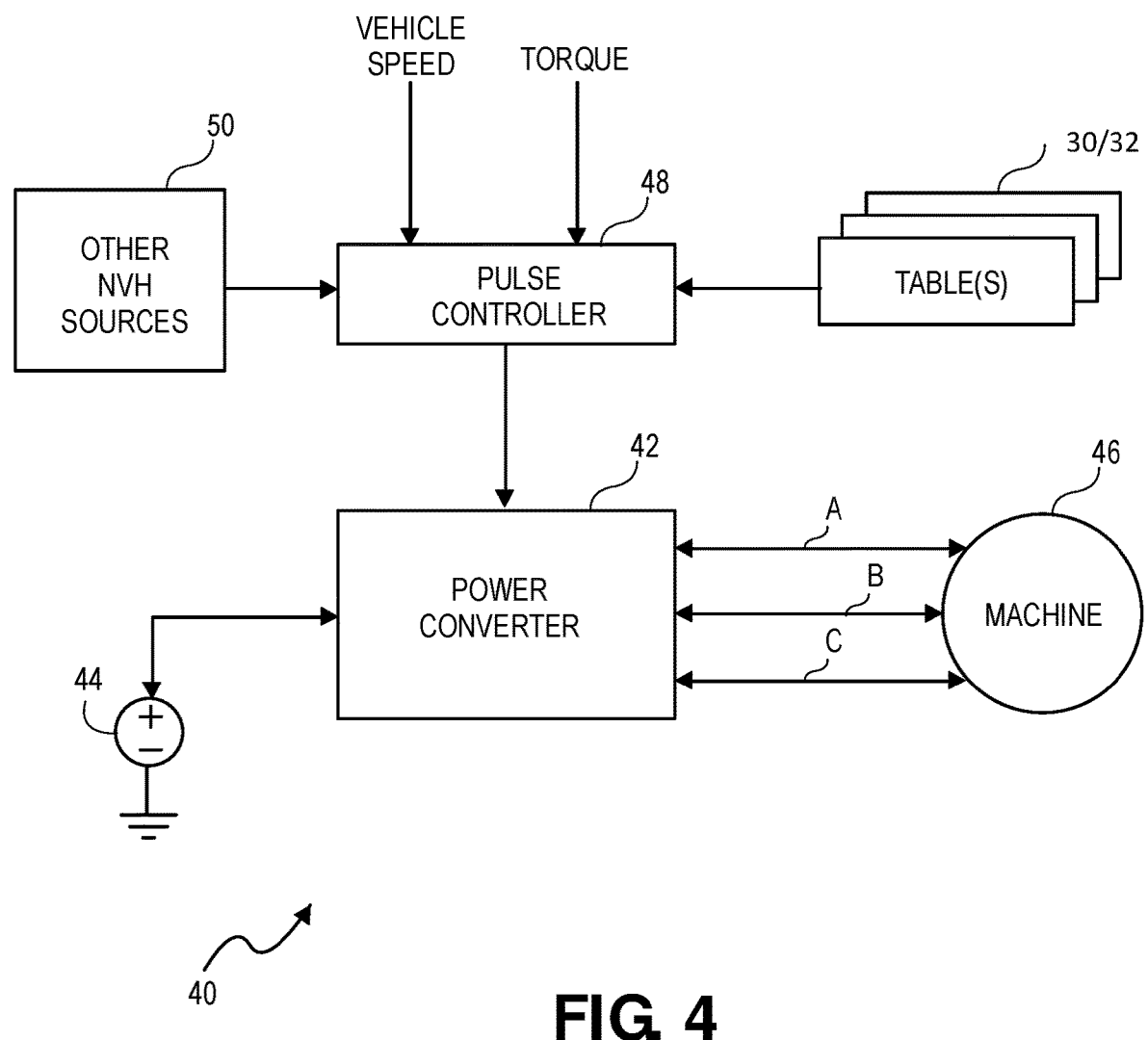
FIG. 4 is a functional block diagram illustrating a motor controller architecture in accordance with a non-exclusive embodiment of the invention.

Referring to FIG. 4, a functional block diagram illustrating a motor controller architecture 40 is illustrated. The architecture 40 includes a power converter 42, a DC power supply 44, an electric machine 46, a pulse controller 48 and one or more tables 30/32. In an optional embodiment, the pulse controller 48 is further arranged to receive one or more inputs indicative of non-drivetrain sources 50 of NVH, such as but not limited to a road sensor that measures road roughness/smoothness, sensors that measure noise and vibration in the cabin of the vehicle due to playing of an entertainment system, opened or closed windows, noise generated by a blower of a climate system, etc.

The power converter 42 operates as a power inverter or power rectifier depending on the direction of energy flow through the system. When the electric machine 46 is operated as a motor, the power converter 42 is responsible for generating three-phased AC power from the DC power supply 44 to drive the machine 46. The three-phased input power, labeled as phase A, phase B, and phase C, is applied to the windings of the stator of the electric machine 46 for generating the Rotating Magnetic Field (RMF) needed to drive the motor as is well known in the art. The lines depicting the various phases, A, B and C, are depicted with arrows on both ends indicating that current can flow both from the power converter 42 to the electric machine 46 when the machine is used as a motor and that current can flow from the electric machine 46 to the power converter 42 when the machine is used as a generator. When the electric machine 46 is operating as a generator, the power converter 42 operates as a power rectifier and the AC power coming from the electric machine 46 is converted to DC power that is stored in the DC power supply 44.

In various embodiments, the power controller 42 may be a conventional power converter or a "boosted" power converter, both of which are described in detail in commonly assigned U.S. Provisional Application No. 62/819,097, filed Mar. 15, 2019, incorporated by reference herein for all purposes.

The pulse controller 48 is responsible for (1) defining when the machine 46 should operate in the continuous mode or pulsed mode, (2) defining the pulsing amplitude, pulsing frequency, and duty cycle for the three-phased input power signals A, B and C when in the pulsed mode and (3) provide control signals so that the power converter 42 can either continuously generate or pulse the three-phase power signals A, B and C provided to the machine 46. During pulsed operation, the three-phase power signals A, B and C are pulsed in accordance with the defined pulsing amplitude, pulsing frequency, and duty cycle.

When determining a pulsing frequency, the pulse controller 48 receives sample inputs indicative of the current speed of the vehicle and torque demand Based on these inputs, the pulse controller 48 ascertains (1) the magnitude of the pulses and (2) the duty cycle as described above. The pulse controller 48 also indexes one or more table(s), such as tables 30 and/or 32, using the current vehicle speed and torque demand indices and determines the corresponding table entry for the pulsing frequency or pattern of frequencies. Information indicative of (1), (2) and (3) is then provided to the power converter 42, which in turn, commensurately controls the magnitude, duty cycle and pulsing frequency of the three-phased input power signals A, B and C. As a result, the machine 46 operates at or near it's the maximum efficiency curve 16 while not generating excessive levels of NVH.

Other Sources of NVH

In an optional embodiment, the pulse controller 48 may also consider other sources of NVH 50. If these other sources of NVH are relatively small, then pulse controller 48 is unlikely to alter or modify the pulsing frequency ascertained from the table(s) 30. On the other hand if the non-drivetrain sources of NVH are high and exceed a threshold, then pulse controller 48 may optionally modify the pulsing frequency to be slower (i.e., a reduced frequency rate). With excessive non-drivetrain sources of NVH, any increase in drivetrain NVH due to using a slower pulsing frequency will typically be masked out. As such, the pulse controller 48 may opt to be more aggressive, reducing the pulsing frequency in order to gain even more efficiency. But since the other sources of NVH mask out any increase in NVH due to the reduced pulsing frequency, the drive experience of the occupant(s) of the vehicle is not adversely or materially affected.

Motor Controller Operational Flow Diagram

Figure 5:
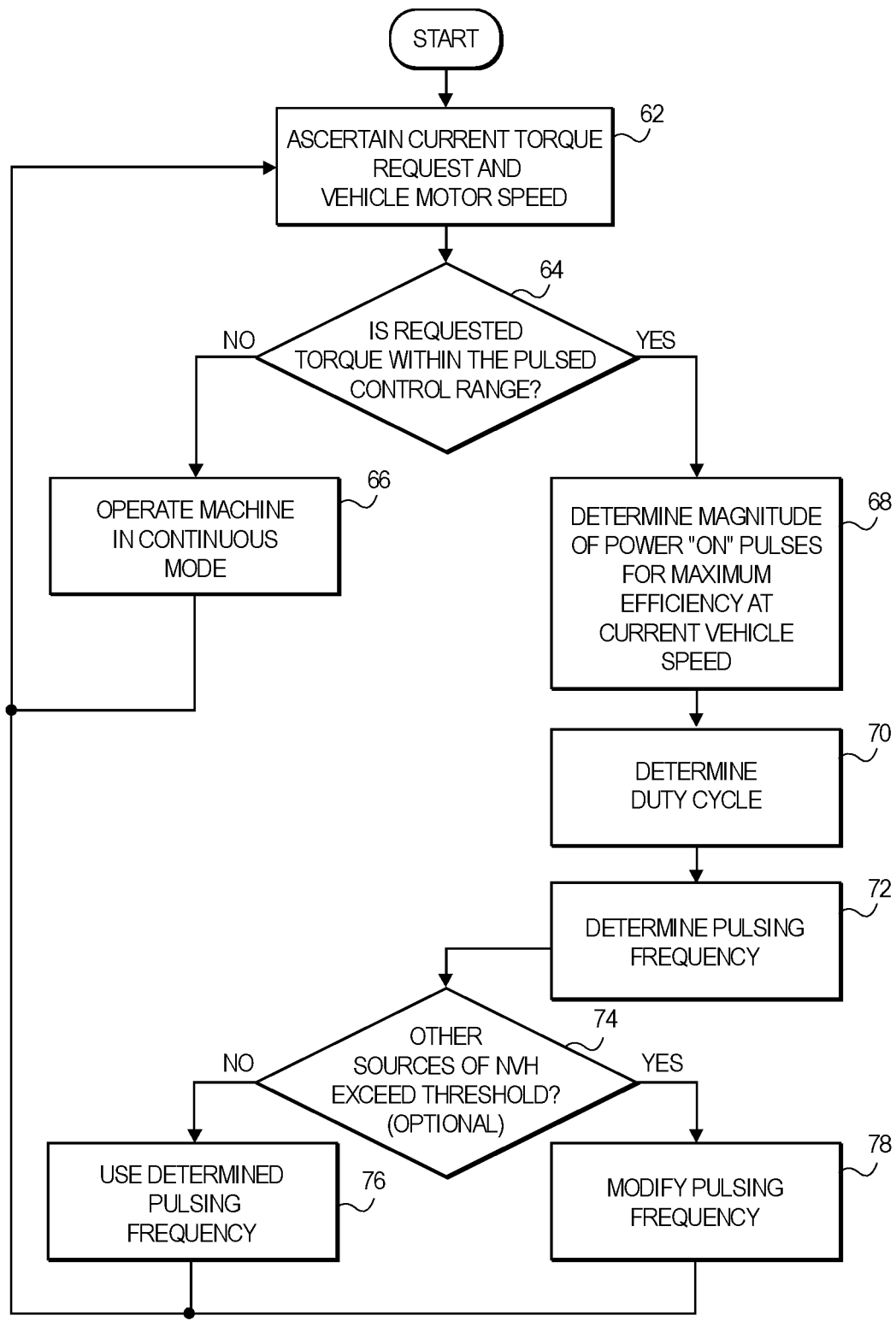
FIG. 5 is an operational flow diagram illustrating steps implemented by the motor controller in accordance with a non-exclusive embodiment of the invention.

Referring to FIG. 5, a flow diagram 60 illustrating operational steps implemented by the motor controller architecture 40 is illustrated.

In the initial step 62, the current torque request and vehicle speed are ascertained.

In decision step 64, a determination is made based on the ascertained current torque request and vehicle speed if the motor should be operated in a continuous mode or the pulsed mode. In other words, a determination is made if the desired motor torque is above or below the most efficient output torque for the current vehicle speed (i.e., the maximum efficiency curve 16 of the motor map illustrated in FIG. 1). Even if the desired torque is below the optimum torque, the motor may be operated in a continuous mode rather than a pulsed mode For example, if the required torque is only slightly less than the optimum torque or if the desired torque is very close to zero. These two cases would result in very high or very low duty cycle operation. In these cases the act of switching may take more energy than is saved so continuous operation may be used instead of pulse operation.

In step 66, the motor is operated in the continuous mode if the requested torque is above the most efficient output torque for the current vehicle speed.

In step 68, decisions for operating the motor in the pulsed mode are initiated if the requested torque is below the most efficient output torque for the current vehicle speed. The initial preparation step involves determining the magnitude of the pulses for maximum efficiency at the current vehicle speed.

In step 70, the duty cycle for operation in the pulsed mode is determined so that the average torque output of the on pulses matches the desired output.

In step 72, a minimum pulse frequency (or pattern of frequencies or a dithered base frequency) that meets acceptable levels of NVH is determined. As described above, the pulsing frequency may be obtained by accessing a table (e.g. table 30, table 32).

In an optional decision step 74, the motor controller architecture 40 determines if other sources of NVH, besides the drivetrain, exceed a threshold.

In step 76, the pulsing frequency determined in step 72 is used if the other sources of NVH do not exceed the threshold.

Alternatively, in step 78, the pulsing frequency may be modified to a lower frequency if the other sources of NVH exceed the threshold. Again, with high levels of non-drivetrain NVH, a lower pulsing frequency may be used, increasing motor efficiency without negatively affecting the driving experience since any additional motor NVH is masked out.

The above steps 62-78 are continuously performed while the motor is in operation. At any particular vehicle speed and torque request, there will be a corresponding most efficient output torque. As the instantaneous torque request and/or current vehicle speed change, a decision is made to operate the motor in either the continuous or pulsed mode as appropriate. When the desired motor torque is below the most efficient output torque for the current motor speed, the overall efficiency of the motor is improved not only by pulsing the motor, but by selecting a minimum pulse frequency that meets acceptable levels of NVH. As a result, for electric motor-powered vehicles, the overall efficiency of the vehicle is improved; meaning the vehicle range between battery recharging (or refueling with hybrids) is extended.

Again, it is noted that the particular tables, and the values provided therein, are merely exemplary and should not be construed as limiting in any regard. Any value proportional to or a function of the motor speed, such as vehicle speed, axle speed, etc. may be used as the index in the columns of table 30. Likewise, any value proportional to or a function of motor torque, such as wheel torque, shaft torque, etc. may be used as the index in the rows of table 30. For any given machine and/or vehicle, graphs and/or tables the various values provided therein need to be constructed from empirical and/or modeled data. Once constructed, the tables can be used to control the pulsed operation of the motor as described herein.

Motor Types and Applications

It should be apparent from the foregoing description that the described pulsed machine control can be utilized in a wide variety of different applications to improve the energy conversion efficiency of a wide variety of different types of electric motors and generators. These include both AC and DC motors/generators. A few representative types of electric machines that may benefit from the described pulsing include both asynchronous and synchronous AC electric machines including Induction machines (IM), switched reluctance machines (SRM), Synchronous Reluctance machines (SynRM), Permanent Magnet Synchronous Reluctance machines (PMaSynRM), Hybrid PMaSynRMs; Externally Excited AC Synchronous machines (SyncAC), Permanent Magnet Synchronous machines (PMSM), Eddy current machines, AC linear machines, AC and DC mechanically commutated machines, axial flux motors, etc. Representative DC electric machines include brushless, electrically excited, permanent magnet, series wound, shunt, brushed, compound and others.

Additional Embodiments

Although automotive applications have been used as an example of a vehicle propulsion application, it should be appreciated that the described control approach is equally beneficial in other propulsion related applications including: electric motors used in other types of vehicles including trucks, cars, carts, motorcycles, bicycles, drones and other flying devices; in robots and other devices that move autonomously within an environment; etc. As such, the term "vehicle" should be broadly construed to include all of the above and any other type of motorized moving assembly whether known now or developed in the future.

Motors used in Heating, Ventilation and Air Conditioning (HVAC) applications are another good example of an application that can benefit from pulsed control. There are several factors that contribute to pulsed motor control being a good fit for HVAC applications. These include the facts that: (a) the motors used in HVAC applications today are predominantly induction motors that don't contain permanent magnets; (b) a high percentage of the motors used in HVAC applications, including in particular variable speed HVAC condensers and/or air handlers, operate a substantial portion of the time operating regions below their high efficiency areas; and (c) the inertia of a fan or pump normally dominates the motor inertia, which tends to further mitigate potential NVH related impacts associated with pulsing.

Although only a few embodiments of the invention have been described in detail, it should be appreciated that the invention may be implemented in many other forms without departing from the spirit or scope of the invention. The various described pulse controllers and other control elements may be implemented, grouped, and configured in a wide variety of different architectures in different embodiments. For example, in some embodiments, the pulse controller may be incorporated into a motor controller or an inverter controller or it may be provided as a separate component. Similarly, for a generator, the pulse controller may be incorporated into a generator controller or a rectifier controller and in combined motor/generators the pulse controller may be incorporated into a combined motor/generator controller or a combined inverter/rectifier controller. In some embodiments, the described control functionality may be implemented algorithmically in software or firmware executed on a processor—which may take any suitable form, including, for example, general purpose processors and microprocessors, DSPs, etc.

The pulse generator or machine controller may be part of a larger control system. For example, in vehicular applications, the described control may be part of a vehicle controller, a powertrain controller, a hybrid powertrain controller, or an ECU (engine control unit), etc. that performs a variety of functions related to vehicle control. In such applications, the vehicle or other relevant controller, etc. may take the form of a single processor that executes all of the required control, or it may include multiple processors that are co-located as part of a powertrain or vehicle control module or that are distributed at various locations within the vehicle. The specific functionalities performed by any one of the processors or control units may be widely varied.

Generally, the schemes for pulsed motor control may be implemented digitally, algorithmically, using analog components or using hybrid approaches. The pulse generator and/or the motor controller may be implemented as code executing on a processor, on programmable logic such as an FPGA (field programmable gate array), in circuitry such as an ASIC (application specific integrated circuit), on a digital signal processor (DSP), using analog components, or any other suitable piece of hardware. In some implementations, the described control schemes may be incorporated into object code to be executed on a digital signal processor (DSP) incorporated into an inverter controller (and/or rectifier controller in the context of a generator and/or a combined inverter/rectifier controller).

Therefore, the present embodiments should be considered illustrative and not restrictive and the invention is not to be limited to the details given herein, but may be modified within the scope and equivalents of the appended claims.

What is claimed is:

1. An electric machine controller for controlling pulsing of an electric machine onboard a vehicle, the electric machine controller arranged to:
    ascertain a quantity proportional to or a function of a rotational speed of the electric machine;
    ascertain a torque request;
    obtain a pulsing frequency from a table by indexing the table using the quantity proportional to or a function of the electric machine rotational speed and the torque request; and
    control pulsed operation of the electric machine by pulsing the electric machine on and off using the pulsing frequency obtained from the table;
    wherein the electric machine controller is arranged to:
        determine if the requested torque is within a pulsed control range of the electric machine; and
        continuously operate the electric machine in a non-pulsed mode if the requested torque is determined to be outside of the pulsed control range.

2. The electric machine controller of claim 1, wherein the quantity proportional to or a function of the electric machine rotational speed is a vehicle speed.

3. The electric machine controller of claim 1, wherein the table is indexed by a range of vehicle speeds along one axis and a range of torque request along a second axis.

4. The electric machine controller of claim 1, wherein the table is indexed by a range of values derived from vehicle speeds along one axis and a range of torque request along a second axis.

5. The electric machine controller of claim 1, wherein the table is indexed by a range of values derived from rotation speeds of the electric machine along one axis and a range of torque requests along a second axis.

6. The electric machine controller of claim 1, wherein the table includes multiple entries that are each indexed by a vehicle speed and a torque request, each of the entries in the table defining at least one pulsing frequency.

7. The electric machine controller of claim 6, wherein the at least one pulsing frequency is a base frequency and one or more dither frequencies is/are added to the base frequency.

8. The electric machine controller of claim 1, wherein the table includes multiple entries that are each indexed by a vehicle speed and torque request, at least one of the entries in the table including multiple pulsing frequencies.

9. The electric machine controller of claim 1, wherein the table includes multiple entries that are each indexed by a vehicle speed and torque request, at least one of the entries in the table including a pattern of pulsing frequencies.

10. The electric machine of claim 1, wherein the electric machine controller arranged to:

ascertain a level of Noise, Vibration and Harshness (NVH) from non-drivetrain sources; and
modify the pulsing frequency obtained from the table at least partially based on the ascertained non-drivetrain sources of NVH,
wherein the pulsing frequency is modified to a lower frequency.

11. The electric machine of claim 1, wherein the electric machine controller arranged to:
dither the pulsing frequency obtained from a table; and
control pulsed operation of the electric machine by pulsing the electric machine on and off using one or more dithering frequencies.

12. The electric machine of claim 1, wherein the electric machine controller is further arranged to:
determine if the requested torque is within a pulsed control range of the electric machine;
determine a magnitude of on pulses of the electric machine if the requested torque is within the pulsed control range of the electric machine;
determine a duty cycle for the on pulses of the electric machine; and
obtain the pulsing frequency of the on pulses.

13. The electric machine of claim 1, wherein pulsing frequency entries in the table are defined using empirical or modeled data.

14. A method of pulse controlling an electric machine used to propel a vehicle by pulsing the electric machine at a pulsing frequency obtained from a table that is indexed using a combination of a speed value and a requested torque, determining if the requested torque is within a pulsed control range of the electric machine, and continuously operating the electric machine in a non-pulsed mode if the requested torque is determined to be outside of pulsed control range.

15. The method of claim 14, further comprising:
determining if the requested torque is within a pulsed control range of the electric machine;
determining a magnitude of on pulses for the electric machine if the requested torque is within the pulsed control range of the electric machine;
determining a duty cycle for the on pulses; and
indexing the table to obtain the pulsing frequency for the on pulses.

16. The method of claim 14, further comprising dithering the pulsing frequency used for pulsing the electrical machine.

17. The method of claim 14, further comprising lowering the pulsing frequency obtained from the table if non-drivetrain sources of Noise, Vibration and Harshness (NVH) exceed a threshold.

18. The method of claim 14, further comprising pulsing the electric machine at multiple frequencies obtained from the table that is indexed using the combination of the speed value and the requested torque.

19. The method of claim 14, further comprising pulsing the electric machine at various frequencies, each of the various frequencies obtained by indexing the table as the speed value and/or the requested torque charges during driving of the vehicle.

20. The method of claim 14, wherein the speed value is derived from one of the following:
(a) a speed of the vehicle;
(b) a rotational speed of the electric machine; or
(c) a combination of (a) and (b).

21. An apparatus comprising an electric machine and a pulse controller arranged to control pulse operation of the electric machine by pulsing the electric machine at a pulsing frequency obtained from a table that is indexed based on a combination of a speed value and a requested torque, wherein the pulse controller is further configured to:
determine if the requested torque is within a pulsed control range of the electric machine; and
continuously operate the electric machine in a non-pulsed mode if the requested torque is determined to be outside of pulsed control range.

22. The apparatus of claim 21, wherein the pulse controller is further configured to:
determine if the requested torque is within a pulsed control range of the electric machine;
determine a magnitude of on pulses for the electric machine if the requested torque is within the pulsed control range of the electric machine;
determine a duty cycle for the on pulses; and
index the table to obtain the pulsing frequency for the on pulses.

23. The apparatus of claim 21, wherein the pulse controller is further configured to dither the pulsing frequency used for pulsing the electrical machine.

24. The apparatus of claim 21, wherein the pulse controller is further configured to pulse the electric machine using multiple frequencies obtained by indexing the table using the combination of the speed value and the requested torque.

25. The apparatus of claim 21, wherein the pulse controller is further configured to pulse the electric machine at various frequencies, each of the various frequencies obtained by indexing the table as:
(a) the speed value changes;
(b) the requested torque charges; or
(c) both (a) and (b) change.

26. The apparatus of claim 21, wherein the electric machine is onboard a vehicle and wherein the speed value is derived from one of the following:
(a) a speed of the vehicle;
(b) a rotational speed of the electric machine; or
(c) a combination of (a) and (b).

27. An electric machine controller for controlling pulsing of an electric machine onboard a vehicle, the electric machine controller arranged to:
ascertain a quantity proportional to or a function of a rotational speed of the electric machine;
ascertain a torque request;
obtain a pulsing frequency from a table by indexing the table using the quantity proportional to or a function of the electric machine rotational speed and the torque request; and
control pulsed operation of the electric machine by pulsing the electric machine on and off using the pulsing frequency obtained from the table;
wherein the table includes multiple entries that are each indexed by a vehicle speed and torque request, at least one of the entries in the table including multiple pulsing frequencies.

28. An electric machine controller for controlling pulsing of an electric machine onboard a vehicle, the electric machine controller arranged to:
ascertain a quantity proportional to or a function of a rotational speed of the electric machine;
ascertain a torque request;
obtain a pulsing frequency from a table by indexing the table using the quantity proportional to or a function of the electric machine rotational speed and the torque request;

control pulsed operation of the electric machine by pulsing the electric machine on and off using the pulsing frequency obtained from the table;

ascertain a level of Noise, Vibration and Harshness (NVH) from non-drivetrain sources; and modify the pulsing frequency obtained from the table at least partially based on the ascertained non-drivetrain sources of NVH;

wherein the pulsing frequency is modified to a lower frequency.

29. An electric machine controller for controlling pulsing of an electric machine onboard a vehicle, the electric machine controller arranged to:

ascertain a quantity proportional to or a function of a rotational speed of the electric machine;

ascertain a torque request;

obtain a pulsing frequency from a table by indexing the table using the quantity proportional to or a function of the electric machine rotational speed and the torque request;

control pulsed operation of the electric machine by pulsing the electric machine on and off using the pulsing frequency obtained from the table;

determine if the requested torque is within a pulsed control range of the electric machine;

determine a magnitude of on pulses of the electric machine if the requested torque is within the pulsed control range of the electric machine;

determine a duty cycle for the on pulses of the electric machine; and obtain the pulsing frequency of the on pulses.

30. A method of pulse controlling an electric machine used to propel a vehicle by pulsing the electric machine at a pulsing frequency obtained from a table that is indexed using a combination of a speed value and a requested torque, determining if the requested torque is within a pulsed control range of the electric machine, determining a magnitude of on pulses for the electric machine if the requested torque is within the pulsed control range of the electric machine, determining a duty cycle for the on pulses, and indexing the table to obtain the pulsing frequency for the on pulses.

31. A method of pulse controlling an electric machine used to propel a vehicle by pulsing the electric machine at a pulsing frequency obtained from a table that is indexed using a combination of a speed value and a requested torque and lowering the pulsing frequency obtained from the table if non-drivetrain sources of Noise, Vibration and Harshness (NVH) exceed a threshold.

32. An apparatus comprising an electric machine and a pulse controller arranged to control pulse operation of the electric machine by pulsing the electric machine at a pulsing frequency obtained from a table that is indexed based on a combination of a speed value and a requested torque, wherein the pulse controller is further configured to:

determine if the requested torque is within a pulsed control range of the electric machine;

determine a magnitude of on pulses for the electric machine if the requested torque is within the pulsed control range of the electric machine;

determine a duty cycle for the on pulses; and index the table to obtain the pulsing frequency for the on pulses.

\* \* \* \* \*